(12) United States Patent
Huang et al.

(10) Patent No.: US 6,589,881 B2
(45) Date of Patent: Jul. 8, 2003

(54) METHOD OF FORMING DUAL DAMASCENE STRUCTURE

(75) Inventors: I-Hsiung Huang, Kaohsiung (TW); Jiunn-Ren Hwang, Hsinchu (TW); Kuei-Chun Hung, Hsinchu (TW); Ching-Hsu Chang, Lin-Nei Hsiang (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/997,339

(22) Filed: Nov. 27, 2001

(65) Prior Publication Data

US 2003/0100188 A1 May 29, 2003

(51) Int. Cl.⁷ ............................................. H01L 21/302
(52) U.S. Cl. ...................... 438/725; 438/740; 438/734; 438/736; 438/738; 438/701; 438/714; 438/723; 438/743; 438/687; 430/5
(58) Field of Search ................................ 430/5; 438/725, 438/740, 734, 736, 738, 701, 714, 723, 743, 687, 618, 624, 637

(56) References Cited

PUBLICATIONS

"Dual Damascene Photo Process Using Negative–Tone Resist"; Shi et. al.; Proc. of SPIE; vol. 3999; pt. 1–2; pp 835–842; 2000.*

"Challenges of Damascene Etching For Copper Interconnect"; Ho et. al.; Proc. of SPIE; vol. 3883; pp 34–41.*

* cited by examiner

*Primary Examiner*—George Goudreau
(74) *Attorney, Agent, or Firm*—J.C. Patents

(57) ABSTRACT

A method of forming a dual damascene structure. A substrate having a conductive layer thereon is provided. A passivation layer, a first dielectric layer, an etching stop layer, a second dielectric layer and cap layer serving as a base anti-reflection coating are sequentially formed over the substrate. The cap layer and the second dielectric layer are patterned to form a first opening that exposes a portion of the etching stop layer. A patterned negative photoresist layer having a second opening therein is formed above the cap layer. The cap layer exposed by the second opening and the second dielectric layer exposed by the first opening are removed. Thereafter, the second dielectric layer exposed by the second opening is removed to form a trench and the first dielectric layer exposed by the first opening is removed to form a via opening. The passivation layer exposed by via opening and then the negative photoresist layer is removed. A conformal barrier layer and a conductive layer are sequentially formed over the trench and the via opening with the conductive layer, completely filling the trench and the via opening.

15 Claims, 6 Drawing Sheets

METHOD OF FORMING DUAL DAMASCENE STRUCTURE

BACKGROUND OF THE INVENTION

1. Field of Invention

The present invention relates to a method of forming the multi-level interconnects of semiconductor devices. More particularly, the present invention relates to a method of forming a dual damascene structure.

2. Description of Related Art

In semiconductor fabrication, various devices are interconnected by conductive lines. In general, the connection point between a conductive wire and an integrated circuit device is referred to as a contact and the connection point between conductive wires is referred to as a via. Resistance along a piece of the conductive wire and parasitic capacitance between conductive wires are major factors that are likely to affect the operating speed of a semiconductor device. In the fabrication of a deep sub-micron semiconductor device, copper is gradually replacing aluminum as the material for forming conductive wires. In the meantime, a low dielectric constant (low K) material is often employed to fabricate inter-metal dielectric layers. Ultimately, resistance-capacitance (RC) delay of the conductive wire is reduced while anti-electromigration capacity of the conductive wire is increased. This is because the capacity to resist electromigration in copper is some 30 to 100 times that of aluminum, via resistance is lowered 10 to 20 times and resistance value is lowered by 30%. However, copper is difficult to etch. Hence, a damascene process is normally employed to fabricate copper interconnects instead of a conventional patterning method.

In general, dual damascene processes can be divided into self-aligned dual damascene (SADD) processes, trench first dual damascene (TFDD) processes and via-first dual damascene (VFDD) processes. FIGS. 1A through 1E are schematic cross-sectional views showing the progression of steps for fabricating a conventional via-first dual damascene structure. First as shown in FIG. 1A, a substrate 100 having a conductive line 102 therein is provided. A passivation layer 104, a first dielectric layer 106, an etching stop layer 108, a second dielectric layer 110, a cap layer 112 and a base anti-reflection coating 114 are sequentially formed over the substrate 100. A positive photoresist layer 116 is formed over the base anti-reflection coating 114. Photolithographic and etching processes of the positive photoresist layer 116 are conducted to form an opening 117. Using the positive photoresist layer 116 as a mask, a portion of the base anti-reflection coating 114, the cap layer 112, the dielectric layer 110, the etching stop layer 108 and the dielectric layer 106 are sequentially removed to form a via opening 118. The via opening 118 exposes a portion of the passivation layer 104.

As shown in FIG. 1B, the positive photoresist layer 116 and the base anti-reflection coating 114 are removed. Thereafter, a trench-filling material 120 is deposited over the substrate 100, completely filling the via opening 118. A back-etching operation is conducted to remove excess trench-filling material 120 outside the via opening 118. Another base anti-reflection layer 122 and another positive photoresist layer 124 are sequentially formed over the substrate 100. The positive photoresist layer 124 is patterned to form an opening 125 by conducting photolithographic and etching processes.

As shown in FIG. 1C, using the positive photoresist layer 124 as a mask, a portion of the base anti-reflection layer 122, the cap layer 112 and the dielectric layer 110 is removed to form a trench 126. In the meantime, a portion of the trench-filling material 120 is also removed. Afterwards, both the positive photoresist layer 124 and the low anti-reflection layer 122 are removed.

As shown in FIG. 1D, the trench-filling material 120 is removed. In a subsequent step, a portion of the etching stop layer 108 exposed by the opening 126 and a portion of the passivation layer 104 exposed by the via opening 118 are removed. Hence, the conductive line 102 in the substrate 100 is exposed.

As shown in FIG. 1E, a conformal barrier layer 128 is formed over the substrate 100. A conductive layer 130 is formed over the barrier layer 128, completely filling the via opening 118 and the trench 126. A planarization operation such as a chemical-mechanical polishing is carried out so that excess conductive and barrier material outside the via opening 118 and the trench 126 are removed.

In the aforementioned via-first dual damascene process, trench-filling material 120 is deposited into the via opening 118. The trench-filling material 120 prevents the entrance of any residual positive photoresist material 124 into the via opening 118, whereby the via plug resistance and RC delay would be increased. However, as line width reduces to 0.13 μm or less, trench-filling material cannot fill an opening having an aspect ratio greater than 5. Furthermore, residual trench-filling material may be retained in the corner regions of the via opening 118 and the trench 126, thereby forming what are known as fence structures 132 around the via opening 118. When barrier material 128 is deposited into the opening 118 and the trench 126, the barrier layer 128 may be broken by the fence structures, leading to a deterioration of the barrier function. This may lead to bridging between metallic interconnects or even device failure.

The base anti-reflection layer 114, the cap layer 112, the dielectric layer 110, the etching stop layer 108 and the dielectric layer 106 are sequentially etched to form the via opening 118 while using the positive photoresist layer 116 as a mask. Since etching depth of two consecutive dielectric layers is considerable, a relatively thick positive photoresist layer 116 is required to pattern the via opening 118. A thick photoresist layer not only increases production cost, but also leads to a drop in production quality and possible peeling of the photoresist layer.

Furthermore, dielectric material with a low dielectric constant (below 3) such as vapor-phase deposition polymers (VPDP), spin-on dielectric (SOD) or spin-on glass (SOG) is often used in the production process. Density, hardness and mechanical strength of these materials are usually small. Hence, slight internal stress may result in large deformation of the via structures and creation of weak spots. Ultimately, production yield is affected.

SUMMARY OF THE INVENTION

Accordingly, one object of the present invention is to provide a method of forming a dual damascene structure capable of minimizing resistance-capacitance delay and increasing device performance.

A second object of this invention is to provide a method of forming a dual damascene structure capable of maintaining identical critical dimension, reducing photoresist cost and increasing process tolerance.

To achieve these and other advantages and in accordance with the purpose of the invention, as embodied and broadly described herein, the invention provides a method of forming a dual damascene structure. A substrate having a conductive layer thereon is provided. A passivation layer, a first dielectric layer, an etching stop layer, a second dielectric layer and cap layer serving as a base anti-reflection coating are sequentially formed over the substrate. The cap layer and the second dielectric layer are patterned to form a first opening that exposes a portion of the etching stop layer. A patterned negative photoresist layer having a second opening therein is formed above the cap layer. The cap layer exposed by the second opening and the second dielectric layer exposed by the first opening are removed. Thereafter, the second dielectric layer exposed by the second opening is removed to form a trench and the first dielectric layer exposed by the first opening is removed to form a via opening. The passivation layer exposed by via opening and then the negative photoresist layer is removed. A conformal barrier layer and a conductive layer are sequentially formed over the trench and the via opening with the conductive layer, completely filling the trench and the via opening.

In addition, this invention may employ a via-first method. A first dielectric layer, a second dielectric layer and a base anti-reflection coating are sequentially formed over a substrate having a conductive layer therein. The base anti-reflection layer, the second dielectric layer and the first dielectric layer are patterned to form a via opening that exposes a portion of the conductive layer. A negative photoresist layer is formed over the base anti-reflection layer. The negative photoresist layer is patterned to form an opening. Using the patterned negative photoresist layer as a mask, the exposed anti-reflection layer and the second dielectric layer are removed to form a trench that exposes a portion of the first dielectric layer. The negative photoresist layer is subsequently removed. Finally, a conformal barrier layer and a conductive layer are sequentially formed over the trench and the via opening with the conductive layer, completely filling the trench and the via opening.

In this invention, a negative photoresist is used to pattern a trench pattern so that the unexposed negative photoresist in the trench region can be removed by chemical developer. Since no photoresist residues are formed, there is no need to deposit trench-filling material into the via opening to maintain proper resistance-capacitance delay. Because trench-filling material is not used in the fabrication process, fence structures are no longer formed in the corner regions of the via opening and the trench. Hence, abnormal bridging between metallic interconnects that may lead to device failure can be prevented.

In addition, this invention also provides a partial etching process to pattern composite low dielectric constant material. Moreover, negative photoresist, which has a higher etching resistance than conventional positive photoresist, is used to form the etching mask. Hence, overall thickness of the negative photoresist layer can be reduced and uniformity of critical dimension is improved. Ultimately, less photoresist material is required and process tolerance is increased. The selection of a low dielectric constant material with a higher density to form the dielectric layer of the dual damascene structure also prevent structural deformation around the via region.

Furthermore, the cap layer for patterning the via opening and the trench is directly used as an anti-reflection layer. Since there is no need to form an anti-reflection layer over the cap layer, some production cost is saved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
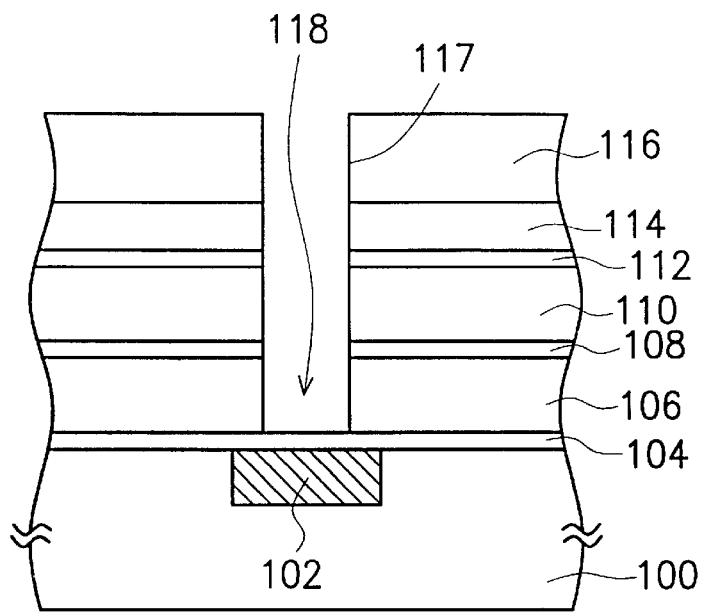
FIGS. 1A through 1E are schematic cross-sectional views showing the progression of steps for fabricating a conventional via-first dual damascene structure.
Figure 1B:
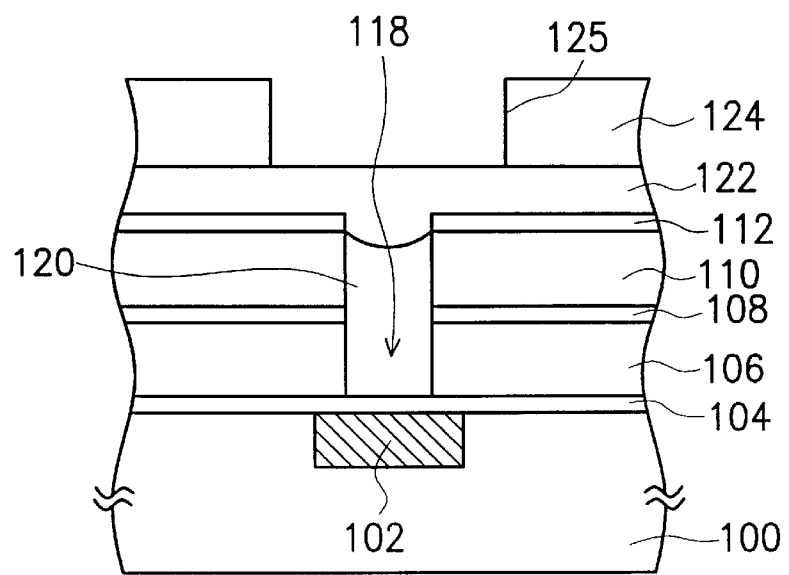
Figure 1C:
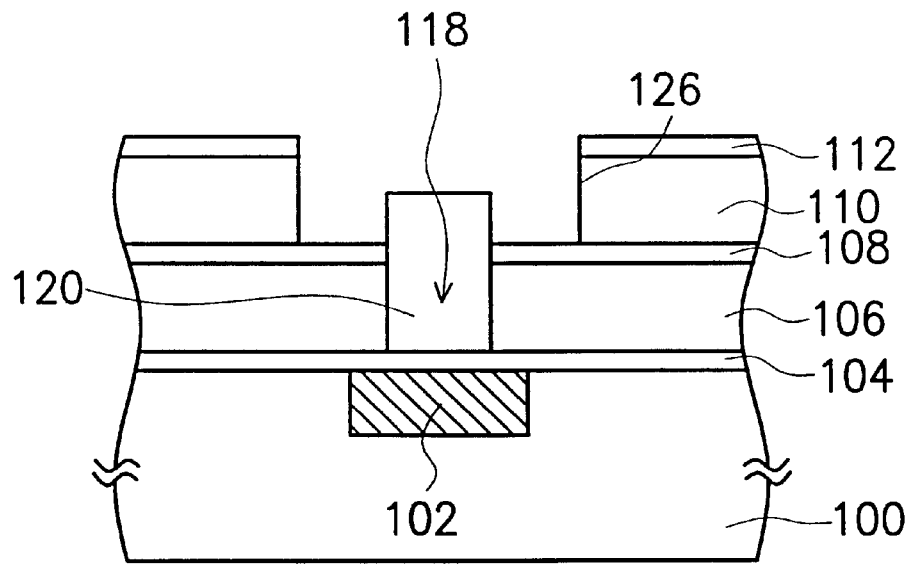
Figure 1D:
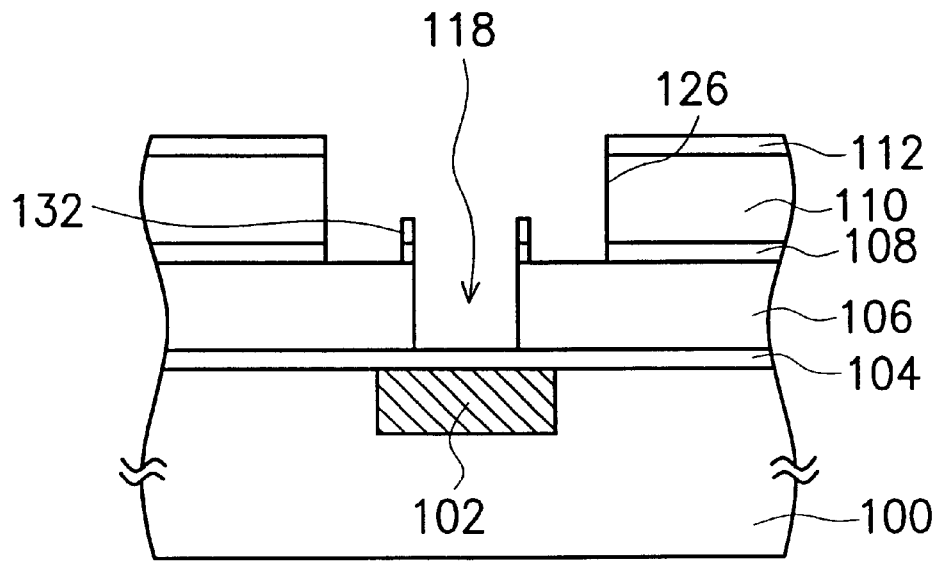
Figure 1E:
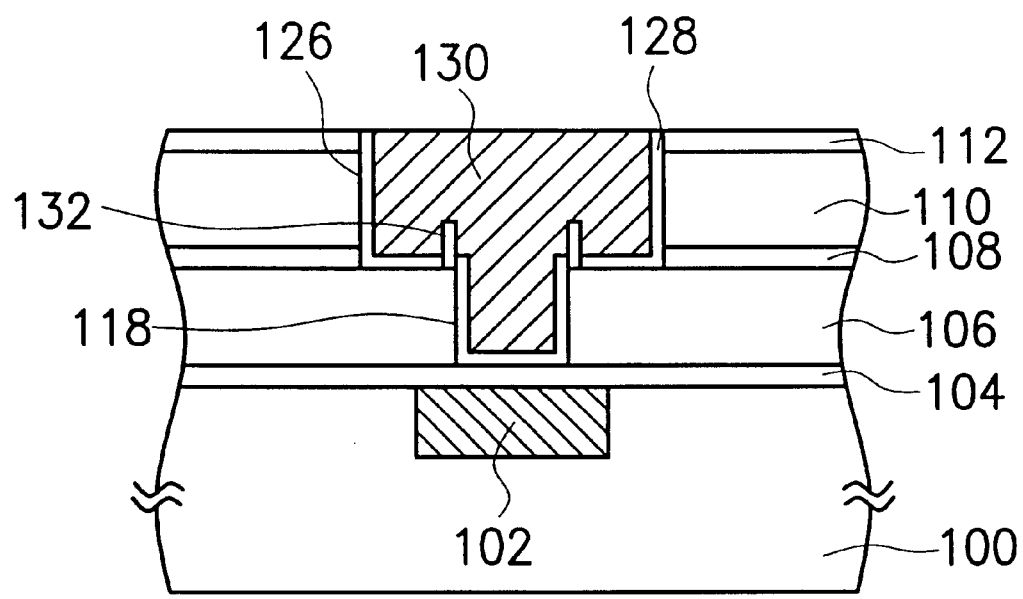

Reference will now be made in detail to the present preferred embodiments of the invention, examples of which are illustrated in the accompanying drawings. Wherever possible, the same reference numbers are used in the drawings and the description to refer to the same or like parts.

Figure 2A:
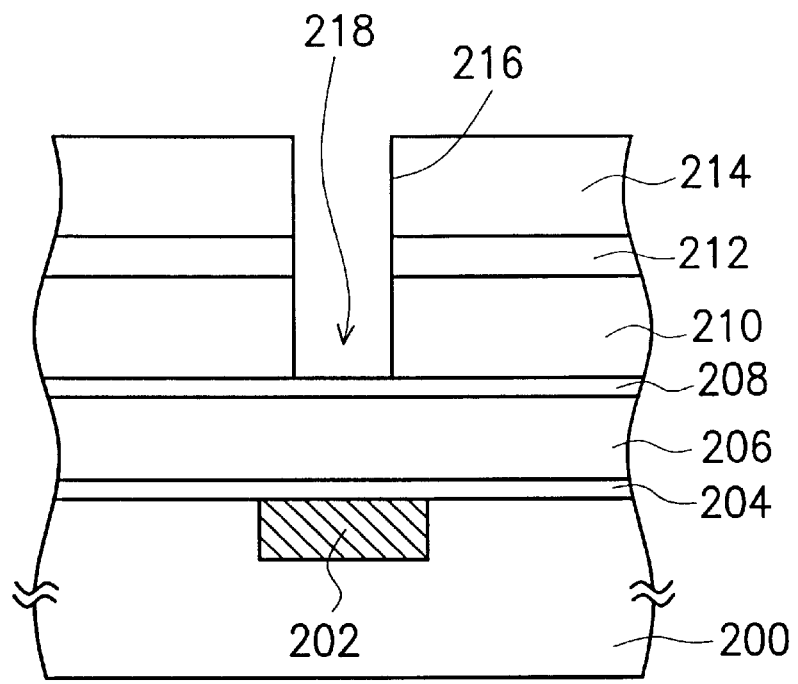
FIGS. 2A through 2F are schematic cross-sectional views showing the progression of steps for producing a dual damascene structure according to one preferred embodiment of this invention.

FIGS. 2A through 2F are schematic cross-sectional views showing the progression of steps for producing a dual damascene structure according to one preferred embodiment of this invention. As shown in FIG. 2A, a substrate 200 having a conductive line 202 therein (to simplify the figure, devices within the substrate 200 are not drawn) is provided. A passivation layer 204, a first dielectric layer 206, an etching stop layer 208, a second dielectric layer 210 and a cap layer 212 are sequentially formed over the substrate 200.

The passivation layer 204 and the etching stop layer 208 can be a silicon nitride layer formed, for example, by chemical vapor deposition (CVD).

The first dielectric layer 206 and the second dielectric layer 210 can be a low dielectric constant (with a dielectric constant around 2.6) material including, for example, poly-arylene ether (SiLK), fluorinated poly-arylene ether (FLARE) and hydrogen silsesquioxane (HSQ). The first dielectric layer 206 and the second dielectric layer 210 are formed, for example, by spin-coating or chemical vapor deposition. However, the first dielectric layer 206 and the second dielectric layer 210 can also be made from a low dielectric constant material (having a dielectric constant between 3.2 and 3.6) with a density higher than the aforementioned low dielectric constant materials including, for example, fluorinated silicate glass (FSG) or undoped silicate glass (FSG). The higher density first dielectric layer 206 and the second dielectric layer 210 are formed, for example, by plasma enhanced chemical vapor deposition (PECVD) or high-density plasma chemical vapor deposition (HDPCVD). The first dielectric layer 206 and the second dielectric layer 210 can be made from identical material or different materials. Preferably, the first dielectric layer 206 has a density higher than the second dielectric layer 210. In other words, the first dielectric layer 206 preferably has a mechanical strength greater than the second dielectric layer 210.

The cap layer 212 is made from a material capable of serving as an anti-reflection coating for the exposure of a photoresist layer such as silicon oxynitride (SiON). The cap layer 212 is formed by chemical vapor deposition, for example.

A photoresist layer 214 is formed over the cap layer 212. The photoresist layer 214 can be a positive photoresist layer or a negative photoresist layer. The photoresist layer 214 is patterned to form an opening 216. Using the photoresist layer 214 as a mask, a portion of the cap layer 212 and the second dielectric layer 210 are removed to form an opening 218 that exposes a portion of the etching stop layer 208.

Figure 2B:
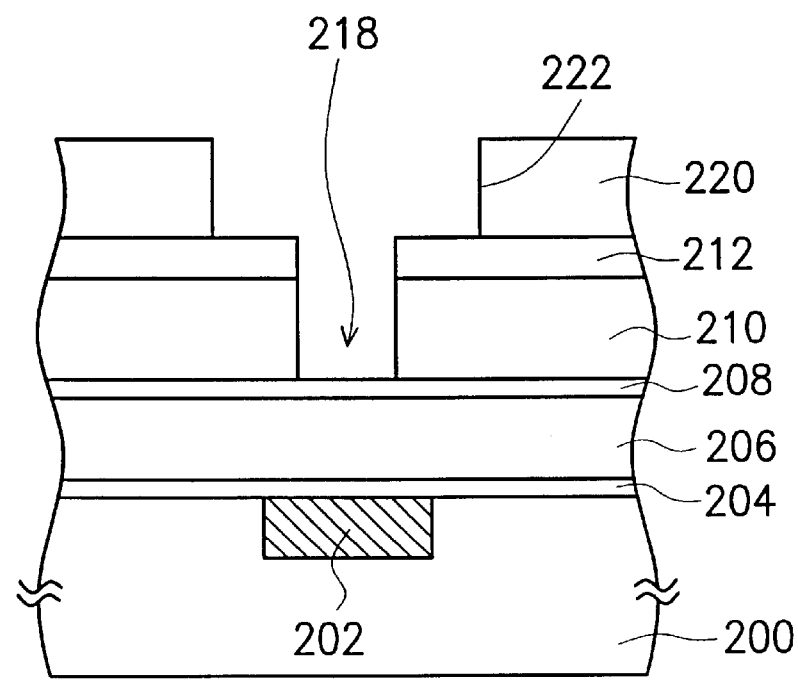

As shown in FIG. 2B, the photoresist layer 214 is completely removed. A negative photoresist layer 220 is formed over the cap layer 212. The negative photoresist layer 220 is patterned to form an opening 222. A negative photoresist layer is used instead of a positive photoresist because the illuminated portion of negative photoresist reacts to form bonds while the illuminated portion of positive photoresist material dissociates. When a positive photoresist is used to pattern the trench, photoresist material at the bottom of the trench may not completely dissociate and remains as residue at the bottom of a via opening. Hence, to prevent the formation of photoresist residue, a trench-filling material needs to top up the via opening before patterning. On the other hand, when a negative photoresist material is used to pattern the trench, the unexposed negative photoresist material within the trench does not form any bonds. Ultimately, the unexposed negative photoresist material can be easily removed by chemical developer. Since no residual negative photoresist forms inside the via opening, there is no need to top up the via opening before patterning the trench.

Figure 2C:
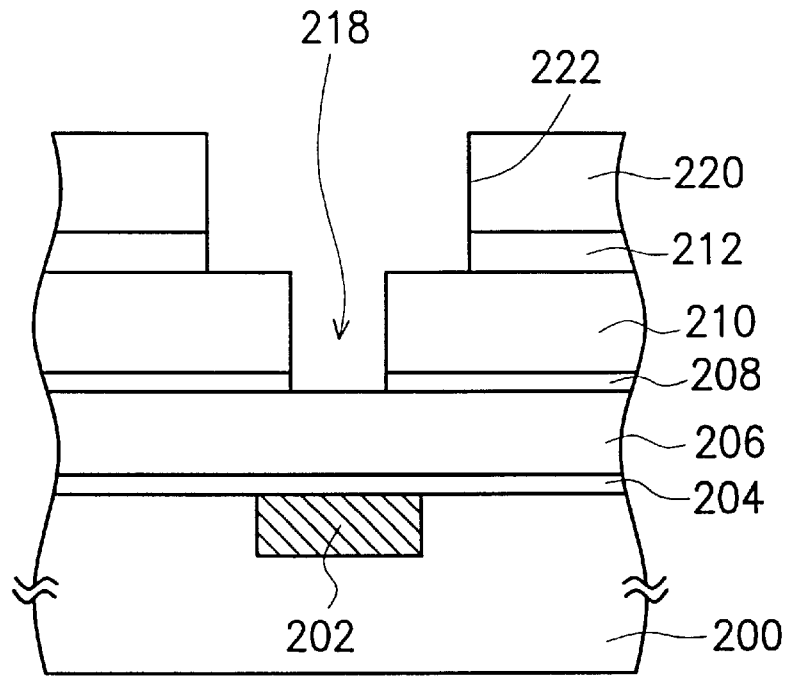
Figure 2D:
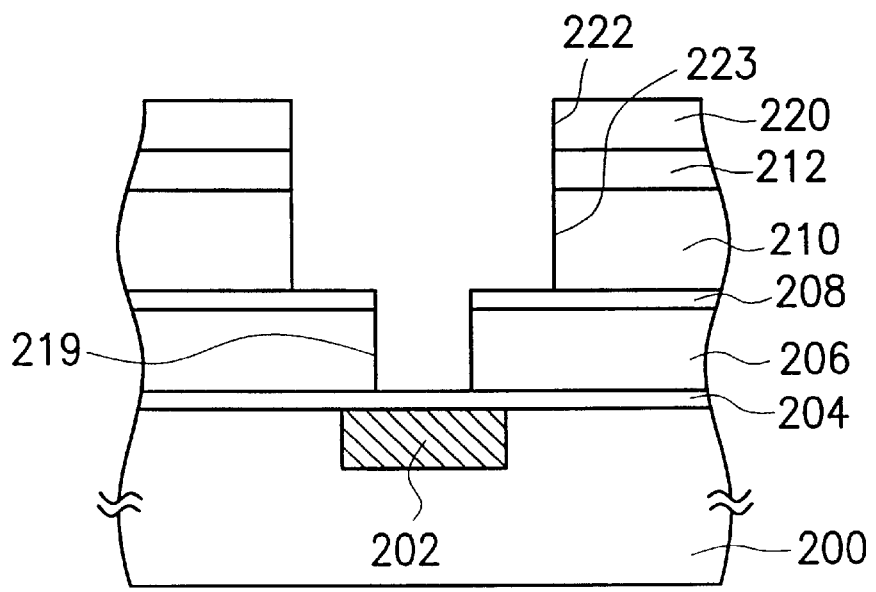

As shown in FIG. 2C, using the negative photoresist layer 220 as a mask, a portion of the cap layer 212 is removed to expose a portion of the second dielectric layer 210. At the same time, a portion of the etching stop layer 208 at the bottom of the opening 218 is removed to expose a portion of the first dielectric layer 206. The exposed cap layer 212 and the exposed etching stop layer 208 are removed, for example, by anisotropic etching.

As shown in FIG. 2D, again using the negative photoresist layer 220 as a mask, a portion of the second dielectric layer 210 within the opening 222 is removed to form a trench 223 that exposes a portion of the etching stop layer 208. In the meantime, a portion of the first dielectric layer 206 within the opening 218 (shown in FIG. 2C) is removed to form a via opening 219 that exposes a portion of the passivation layer 204.

Figure 2E:
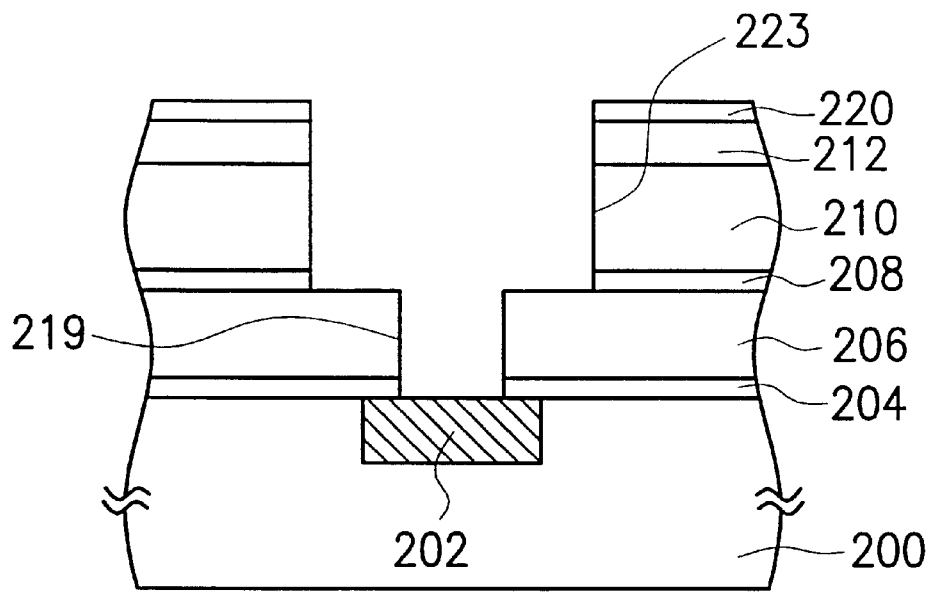

As shown in FIG. 2E, using the negative photoresist layer 220 as a mask, a portion of the etching stop layer 208 within the trench 223 is removed to expose a portion of the first dielectric layer 206. In the meantime, a portion of the passivation layer 204 within the via opening 219 is removed to expose a portion of the conductive line 202. The exposed etching stop layer 208 and the passivation layer 204 are removed, for example, by anisotropic etching.

Figure 2F:
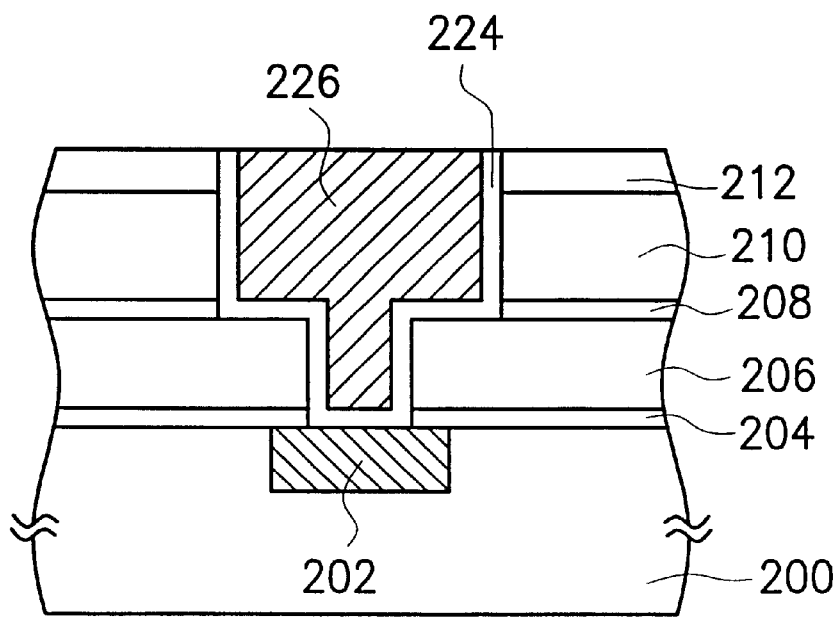

As shown in FIG. 2F, the negative photoresist layer 220 is removed. A conformal barrier layer 224 is formed over the substrate 200. The barrier layer 224 can be a tantalum nitride (TaN), a titanium nitride (TiN) or a titanium silicon nitride (TiSiN) layer, for example. A conductive layer 226 is formed over the barrier layer 224. The conductive layer 226 completely fills the opening 218 and the opening 222. The conductive layer 226 can be a copper layer formed, for example, by physical vapor deposition (PVD), chemical vapor deposition (CVD) or sputtering. Thereafter, a chemical-mechanical polishing operation is conducted to remove the metallic layer 226 and the barrier layer 224 outside the trench 223 exposing the cap layer 212. Here, a dual damascene structure is formed.

The above embodiment uses a partial etching process to pattern a dual damascene structure. However, a direct patterning of a via opening may be employed. The base anti-reflection layer 212, the second dielectric layer 210 and the first dielectric layer 206 can be directly patterned to form a dielectric opening 219 that exposes a portion of the conductive line 202. Thereafter, a negative photoresist layer 220 is formed over the base anti-reflection layer 212. The negative photoresist layer 220 is patterned to form an opening 222. Using the patterned negative photoresist layer 220 as a mask, the base anti-reflection layer 212 and the second dielectric layer 210 within the opening 222 is removed to form a trench 223 that exposes the first dielectric layer 206. The negative photoresist layer 220 is removed. A conformal barrier layer 224 is formed over the trench 223 and the via opening 219. Finally, a conductive layer 226 is formed over the barrier layer 224, completely filling the trench 223 and the via opening 219.

Principal advantages of the method of forming a dual damascene structure according to this invention include:

1. A negative photoresist is used to pattern a trench pattern so that the unexposed negative photoresist in the trench region can be removed by chemical developer. Since photoresist residues are not formed, there is no need to deposit trench-filling material into the via opening to maintain proper resistance-capacitance delay. Because trench-filling material is not used in the fabrication process, fence structures are no longer formed in the corner regions of the via opening and the trench. Hence, abnormal bridging between metallic interconnects that may lead to device failure can be prevented.

2. A partial etching process is used to pattern composite low dielectric constant material. In addition, negative photoresist, which has a higher etching resistance than conventional positive photoresist, is used to form the etching mask. Hence, overall thickness of the negative photoresist layer can be reduced and uniformity of critical dimension is improved. Ultimately, less photoresist material is required and process tolerance is increased.

3. The selection of a low dielectric constant material with a higher density to form the dielectric layer of the dual damascene structure prevents structural deformation around the via region.

4. The cap layer for patterning the via opening and the trench is directly used as an anti-reflection layer and there is no need to form an anti-reflection layer over the cap layer. Thus, some production cost is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, comprising:

providing a substrate having a conductive line therein;

sequentially forming a passivation layer, a first dielectric layer, an etching stop layer, a second dielectric layer and a cap layer over the substrate, wherein the cap layer serves also as a base anti-reflection layer;

patterning the cap layer and the second dielectric layer to form a first opening exposing a portion of the etching stop layer;

forming a patterned negative photoresist layer over the cap layer, wherein the patterned negative photoresist layer has a second opening therein, and the second opening exposes a portion of the cap layer and the first opening;

simultaneously removing the exposed portion of the cap layer within the second opening to expose a portion of the second dielectric layer and removing the exposed portion of the etching stop layer within the first opening to expose a portion of the first dielectric layer;

simultaneously removing the exposed portion of the second dielectric layer within the second opening to form a trench and removing the exposed portion of the first dielectric layer within the first opening to form a via opening to expose a portion of the passivation layer;

removing the exposed portion of the passivation layer within the via opening;

removing the negative photoresist layer;

forming a conformal barrier layer over the trench and the via opening; and forming a conductive layer over the barrier layer, wherein the conductive layer completely fills the trench and the via opening.

2. The method of claim 1, wherein material forming the first dielectric layer is selected from a group consisting of fluorinated silicate glass and undoped silicate glass.

3. The method of claim 2, wherein forming the first dielectric layer includes conducting a plasma-enhanced chemical vapor deposition or a high-density plasma chemical vapor deposition.

4. The method of claim 1, wherein material forming the first dielectric layer is selected from a group consisting of poly-arylene ether (SiLK), fluorinated poly-arylene ether (FLARE) and hydrogen silsesquioxane (HSQ).

5. The method of claim 4, wherein forming the first dielectric layer includes spin coating or conducting a chemical vapor deposition.

6. The method of claim 1, wherein material forming the second dielectric layer is selected from a group consisting of fluorinated silicate glass and undoped silicate glass.

7. The method of claim 6, wherein forming the second dielectric layer includes conducting a plasma-enhanced chemical vapor deposition or a high-density plasma chemical vapor deposition.

8. The method of claim 1, wherein material forming the second dielectric layer is selected from a group consisting of poly-arylene ether (SiLK), fluorinated poly-arylene ether (FLARE) and hydrogen silsesquioxane (HSQ).

9. The method of claim 8, wherein forming the second dielectric layer includes spin coating or conducting a chemical vapor deposition.

10. The method of claim 1, wherein the cap layer includes a silicon oxynitride layer.

11. The method of claim 10, wherein forming the cap layer includes conducting a chemical vapor deposition process.

12. A method of forming a dual damascene structure, comprising:

providing a substrate having a conductive line therein;

forming a composite dielectric layer over the substrate, wherein the composite dielectric layer includes at least a first low dielectric constant layer, a second low dielectric constant layer, and an etching stop layer between the first low dielectric constant layer and the second low dielectric constant layer, and the first low dielectric constant layer has a mechanical strength stronger than the second low dielectric constant layer;

forming a cap layer over the composite dielectric layer, wherein the cap layer also serves as a base anti-reflection layer;

patterning the cap layer and the second low dielectric constant layer to form a first opening exposing a portion of the etching stop layer;

forming a negative photoresist layer over the cap layer;

patterning the negative photoresist layer to form a second opening, the second opening exposing a portion of the cap layer and the first opening;

simultaneously removing the exposed portion of the cap layer within the second opening to expose a portion of the second low dielectric constant layer and removing the exposed portion of the etching stop layer within the first opening to expose a portion of the first low dielectric constant layer;

simultaneously removing the exposed portion of the second low dielectric constant layer within the second opening to form a trench and removing the exposed portion of the first low dielectric constant layer within the first opening to form a via opening;

removing the negative photoresist layer;

forming a conformal barrier layer over the trench and the via opening; and forming a conductive layer over the barrier layer, wherein the conductive layer completely fills the trench and the via opening.

13. The method of claim 12, wherein material forming the first low dielectric constant layer is selected from a group consisting of fluorinated silicate glass and undoped silicate glass.

14. The method of claim 12, wherein material forming the second dielectric layer is selected from a group consisting of poly-arylene ether (SiLK), fluorinated poly-arylene ether (FLARE) and hydrogen silsesquioxane (HSQ).

15. The method of claim 12, wherein material forming the cap layer includes silicon oxynitride.

* * * * *